United States Patent [19]

Mueller et al.

[11] 3,973,228

[45] Aug. 3, 1976

[54] ELECTRONIC TUNER CONTROL SYSTEM

[75] Inventors: David J. Mueller, Northlake; Hugh F. Bonney, Des Plaines, both of Ill.

[73] Assignee: Quasar Electronics Corporation, Franklin Park, Ill.

[22] Filed: Sept. 4, 1974

[21] Appl. No.: 503,107

[52] U.S. Cl. .............................. 334/15; 325/459; 325/468
[51] Int. Cl.² ...................... H03J 1/22; H03H 5/12
[58] Field of Search ............ 334/15, 18; 325/459, 325/464, 468

[56] References Cited
UNITED STATES PATENTS

3,849,731  11/1974  Morita .............................. 325/464
3,893,049  7/1975  Bray ................................. 334/15

Primary Examiner—John K. Corbin
Assistant Examiner—Wm. H. Punter
Attorney, Agent, or Firm—Drummond, Nelson & Ptak

[57] ABSTRACT

An electronic tuner control system particularly adapted for television receivers employs a gated oscillator for sequentially stepping the tuner from one channel selection to the next. The system includes a counter responsive to the gated oscillator for causing the sequential scanning or stepping to take place in either the "up" or "down" direction. Separate tuning potentiometers are associated with each channel and are selected in sequence under control of the counter. Each potentiometer is set to either a first range of settings indicative of a valid tuning voltage for that channel or to a second range indicating that no tuning or channel selection is to be effected for such a second or "non-preferred" setting. All of the tuning potentiometers are coupled to an analog steering circuit comprised of isolating diodes, and only one potentiometer at a time is selected to apply a tuning voltage to the output of the steering circuit under control of the counter. The output voltage from the analog steering circuit comprises the tuning voltage supplied to the electronic tuners of the receiver, and this voltage also is sensed by an override circuit which automatically causes the oscillator to operate at a high frequency to effectively skip over the "non-preferred" channels. When a channel which has a valid tuning voltage on it is selected, the override circuit causes the oscillator to operate at a lower frequency to give the operator of the tuning system an opportunity to de-energize or release the control circuit to stop on the selected channel. If the control circuit is released or de-energized when the oscillator is operating in its higher frequency, it continues to operate until a channel with a valid tuning voltage is selected, whereupon further scanning terminates.

13 Claims, 5 Drawing Figures

EQUIVALENT CIRCUITS
IF POT IS NOT SELECTED

Fig. 3

IF ONE SELECT LINE IS LOW (POT STILL NOT SELECTED

Fig. 4

IF BOTH LINES ARE LOW POT IS SELECTED

Fig. 5

ELECTRONIC TUNER CONTROL SYSTEM

BACKGROUND OF THE INVENTION

For many years, mechanical turret tuners have been commonly employed in television receivers to select the VHF channels, and a second rotary or continuous tuner has been used to select the UHF channels. For most television receivers, this requires two different channel selection knobs, and the tuners themselves are relatively bulky and require a relatively large amount of space within the television receiver cabinet. Because of the nature of these tuners, it also is necessary to locate them directly behind the front panel of the receiver which imposes significant restrictions on the cabinet design and the arrangement of parts within the cabinet, reducing the flexibility of design which would be possible if such tuners could be eliminated.

Some mechanical tuners are equipped with programmable switches to permit them to be used to select either a UHF or a VHF channel at a tuner position by programming the tuner for the local area where the television receiver is to be used. The disadvantages of the cumbersome mechanical turret tuners, however, are not overcome; but the tuner is made even more complicated by such an arrangement.

It is desirable and in the United States it is becoming necessary to effect selection of the UHF and VHF channels in a comparable manner. When such tuning compatability is imposed, significant problems are encountered in providing a mechanical turret-type tuner having detented positions for all of the possible UHF channels which must be accommodated for television receivers capable of operating in any given locality in which the receiver is capable of receiving the transmitted television signals. UHF turret tuners with detent tuning selection for each of the 70 possible UHF channels are difficult and expensive to manufacture, and even the display of all the UHF channel numbers in a manner which is compatable with the display for the much smaller number of VHF channels is difficult to accomplish.

The introduction of voltage variable capacitor or varactor tuners for the VHF and UHF bands to which a television receiver can be tuned has opened the way for electronic tuning of television receivers. This replaces the cumbersome mechanical turret tuners and allows greater flexibility in the design of the channel selection panel and in the location of tuner parts within the receiver cabinet.

Even so, if the receiver is to be made capable of individual selection of any one of the 70 UHF channels, in addition to the VHF channels, a large number of individual tuning components still are required. It is desirable to reduce the number of tuning components to a number sufficient to cover all of the channels in any given area in which the television receiver is used and also to make a provision in the receiver to cause it to be non-responsive to any particular channel positions which are not used in a given locality.

It also is desirable to provide a channel selection system in which control of the channels can be effected by sequentially scanning or stopping on only those channels which can be received in a given locality and skipping over the channels which cannot be received in that locality. Such a system then also should be readily adaptable to remote control operation as well as front panel operation on the television receiver itself. Ideally, the system should be capable of sequentially stepping or scanning through the channels to which the receiver is to respond in both the "up" and "down" directions of channel sequence.

SUMMARY OF THE INVENTION

Accordingly, it is an object of this invention to provide an improved tuner control system.

It is another object of this invention to provide an improved electronic tuner control system.

It is an additional object of this invention to provide an improved electronic tuner control system for a television receiver.

It is a further object of this invention to provide an improved tuner control system for sequentially scanning or stepping from one channel to the next with a provision for skipping over certain non-desired channels in the scanning sequence.

It is still another object of this invention to provide a tuner control system for a television receiver capable of stepping sequentially from one channel to the next in either the up or down direction.

It is a still further object of this invention to sequentially step from channel to channel in an electronic tuning system for a television receiver at a first relatively slow rate for pre-selected channels to which the receiver is to respond and for skipping over other non-selected channels at a relatively high frequency.

In accordance with a preferred embodiment of this invention, an electronic turner control system, particularly useful with a television receiver using a voltage variable capacitor or varactor diode tuner, includes a gated clock pulse generator capable of producing clock pulses at at least one frequency on its output. A control circuit is energizable in response to the closure of a switch for initiating and maintaining operation of the gated clock pulse generator to cause it to produce clock pulses in response to the energization of the control circuit which terminates operation of the gated clock pulse generator when the control circuit is de-energized by opening the switch. An override circuit is supplied with input signals corresponding to the selected tuning voltage and is coupled to the gated clock pulse generator to maintain its operation for so long as the tuning voltages are within one predetermined range. The override circuit terminates operation of the gated clock pulse generator following deenergization of the control circuit when the tuning voltage is in another predetermined range.

In a more specific embodiment of the invention, the signal applied to the override circuit is obtained from an analog tuning voltage established by tuning potentiometers selected under control of a counter driven by the gated clock pulse generator. Tuning voltages in the one predetermined range correspond to "non-selected" or "non-preferred" channels which are to be skipped by the system. Tuning voltages in the other predetermined range correspond to valid channels which are to be selected by the tuner control system upon opening of the switch which de-energizes the control circuit.

In another more specific embodiment of the invention, the gated clock pulse generator operates at a relatively low frequency whenever the tuning voltage supplied to the override circuit is in the other of the predetermined range and operates at a relatively high frequency whenever the tuning voltage supplied to the override circuit is in the one predetermined range.

BRIEF DESCRIPTION OF THE DRAWINGS

FIGS. 1a and 1b are a schematic diagram, partially in block form, of a preferred embodiment of the invention used with a television receiver;

FIG. 2 illustrates the manner in which FIGS. 1a and 1b are interconnected to form the complete circuit.

DETAILED DESCRIPTION

Figures 1A, 2:
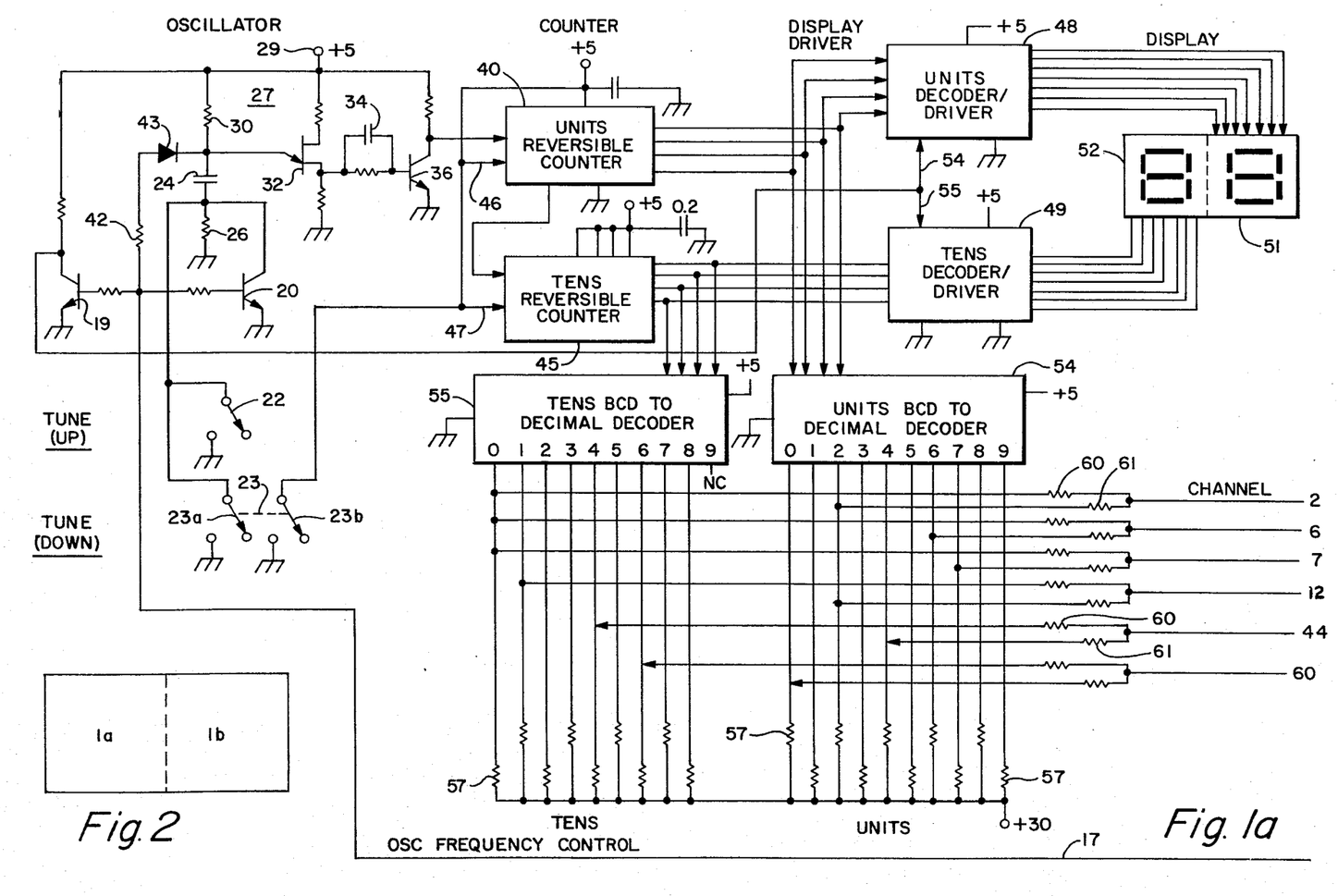
Figure 1B:
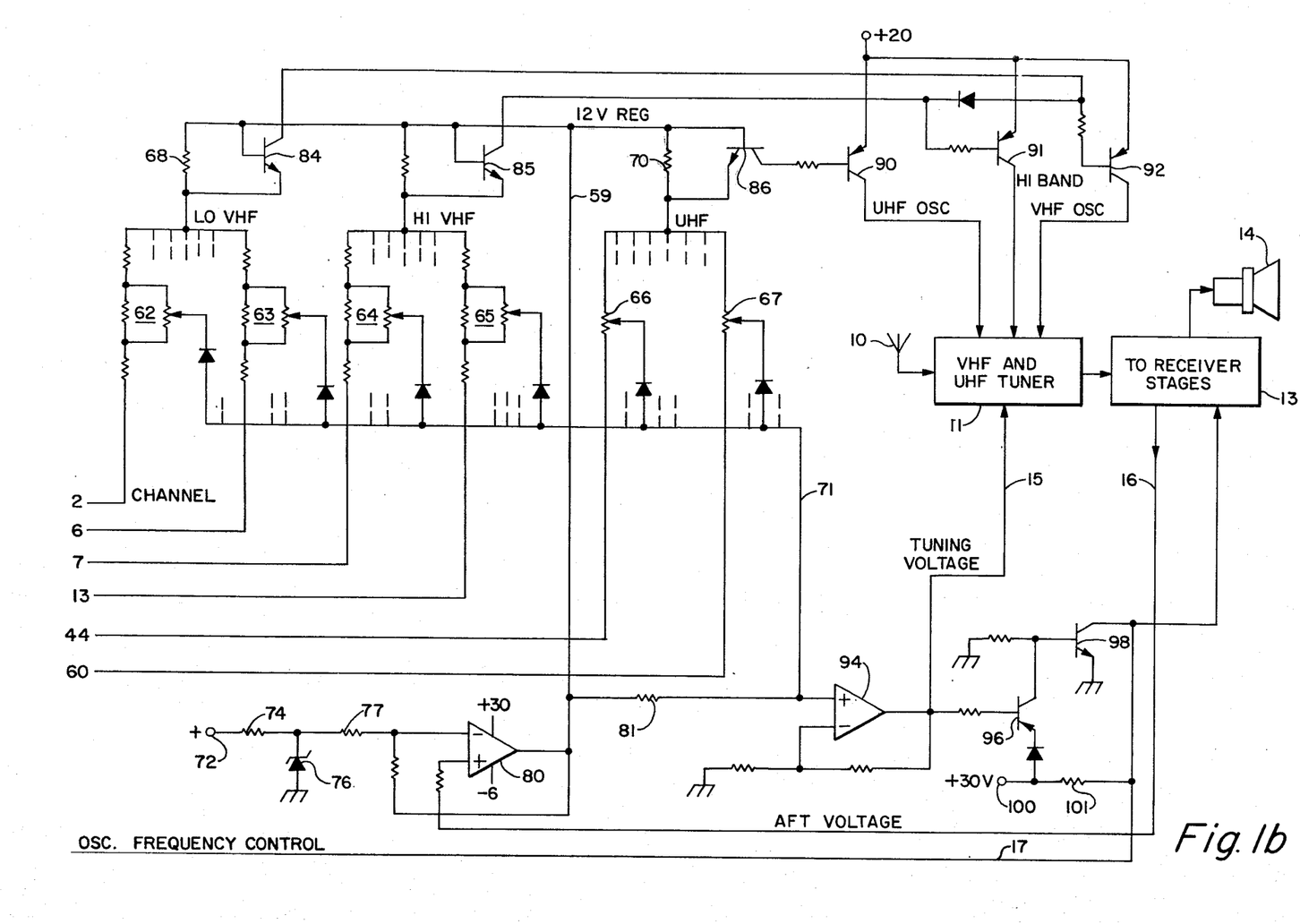

Referring now to the block diagram of FIGS. 1a and 1b placed together as shown in FIG. 2, an electronic tuner control system is shown used with a television receiver. The television receiver is shown on the right-hand portion of FIG. 1b and includes a conventional antenna 10 supplying signals to a VHF and UHF tuner stage 11, which preferably employs voltage variable capacitors or varactor diodes as the tuning elements which respond to a tuning voltage to effect the desired tuning. The output of the tuner stage 11 is applied to conventional receiver stages 13, which may be for a black and white or a color television receiver, to produce an output for driving a cathode ray tube 14 of a black and white or color television receiver. The tuning voltage for the particular channel selected by the tuner control circuit is applied on a lead 15 to the varactor diode tuning sections of the VHF and UHF tuner 11 in a conventional manner. The receiver stages 13 also produce an automatic fine tuning voltage (AFT or AFC voltage) on an output lead 16, which is used to lock the tuning voltage on the lead 15 to the selected channel for the duration of time that the receiver is tuned to that channel. The production of the AFT voltage is accomplished by a conventional AFT discriminator (not shown) of any suitable type normally used in television receivers.

The remainder of the circuit shown in FIGS. 1a and 1b is a tuner control circuit for selecting the particular tuning voltage and the appropriate section of the tuner 11, that is high or low band VHF or UHF, for electronically tuning the television receiver to a desired channel.

Initially, assume that the receiver is tuned to and is receiving a channel. This is its stable or steady state operating condition. In this condition, the potential on a lead 17, labeled "oscillator frequency control", is a low, near ground potential obtained in a manner which will be described in detail subsequently. This low potential is applied in common to the bases of a pair of NPN control transistors 19 and 20 and renders them non-conductive. At the same time, when a desired channel has been selected and is being displayed by the television receiver, a pair of control switches 22 and 23 both are open as illustrated on the lefthand side of FIG. 1a. These control switches are shown as simple single-throw switches, the switch 22 is movable either to a closed position, connecting it to ground, or to an open circuit position. The switch 23 has two contacts 23a and 23b, both of which are moved together to connect them to ground or to an open circuit. The contacts 22 and 23a are connected together in common to the junction of a timing control capacitor 24 and a resistor 26 in a gated clock pulse generator comprising a gated unijunction oscillator circuit 27.

For the steady state circuit condition which has been assumed, the timing capacitor 24 is charged up to its maximum value from a relatively low voltage source (approximately 5 volts) coupled to an input terminal 29. The charging path extends from the terminal 29 through a relatively high value resistor 30 to the capacitor 24 and through the resistor 26 to ground. The junction between the capacitor 24 and the resistor 30 is connected to the gate of a unijunction transistor 32, interconnected with the capacitor 24 in a conventional unijunction oscillator configuration. The unijunction transistor 32, however, does not fire in this condition of operation, even though the capacitor 24 is fully charged. This is due to the fact that the resistor 26 is in the discharge loop for the capacitor and this resistor has a high value of resistance (approximately 75000 ohms) which is sufficient to prevent the capacitor 24 and unijunction transistor 32 cannot go into an oscillation loop. Thus, the system remains in this condition of operation until one or the other of the switches 22 or 23 is closed to couple ground potential to the junction between the capacitor 24 and the resistor 26.

So far as the operation of the gated clock pulse generator oscillator 27 is concerned, closure of either of the switches 22 or 23 has the same affect. The switch 22, however, is used to cause sequential stepping of the channel selection of the tuner control circuit in the up direction, whereas closure of the switch 23 effects sequential stepping of the tuner control circuit in the down direction. Although the switches 22 and 23 are illustrated as simple switches, that can take any number of desired configurations and can be mechanical switches, electronic switches, presence sensing switches; and can be either directly operated on the front panel of the television receiver or can be operated through remote control circuitry. The particular type of switches which are used is unimportant so long as the necessary switching function is accomplished.

When either one of the switches 22 or 23 is closed to its lefthand contact to apply ground potential to the junction between the capacitor 24 and resistor 26, the resistor 26 effectively is removed from the oscillator loop. This permits the capacitor 24 immediately to discharge through the unijunction transistor 32 providing the first output pulse as soon as either one of the switches 22 or 23 is closed. This sets the circuit into operation, with the oscillator 27 operating either at its low or high frequency of operation in accordance with the potential appearing on the oscillator frequency control lead 17. The first pulse is applied at the low frequency rate (selected to be approximately 2 hertz), with the frequency controlled by the charging path through the resistor 30 from the potential applied to the terminal 29. The pulses produced by the unijunction transistor 32 are shaped by a parallel RC shaping network 34 and are applied to the base of an NPN amplifier transistor 36. The pulses are positive going pulses; so that each one renders the normally nonconductive transistor 36 conductive to apply a positive clock pulse to the input of a "units" reversible counter 40 to step the counter from the count it had just prior to this pulse to its next count.

So long as the potential on the lead 17 remains low or near ground potential, the frequency of operation of the oscillator 27 is at its low frequency rate determined by the charging path through the resistor 30.

The system is constructed to differentiate between preferred or "valid" channels for a given locality and non-preferred or non-valid channels. The latter comprise channels which the operator of the receiver does not care to receive in the particular locality in which the receiver is being operated. Normally, these would be channel positions for which no transmitting station exists in that locality. The non-preferred channels, of course, will vary from city to city, so that it is necessary to be able to easily adjust the receiver to establish the preferred and non-preferred channels. The manner in which this is done is discussed in a subsequent portion of this description.

For the purpose of the present discussion, however, whenever the reversible counter circuit causes the tuner control circuit to step to a non-preferred channel, the potential on the lead 17 goes high. This causes both of the NPN transistors 19 and 20 to become conductive. At the same time, a relatively high positive potential was applied through a low value resistor 42 and an isolating diode 43 to the junction between the capacitor 24 and the resistor 30. This results in a rapid charging of the capacitor 24 are a rate selected to cause the oscillator 27 to operate at approximately 2 kilohertz. If the switch 22 or 23, which was closed to initiate the operation of the oscillator now is opened, the transistor 20 maintains the operation of the oscillator 27 at its high frequency rate until a low potential once again appears on the lead 17. This latter condition exists when a valid or preferred channel is selected by the system through the operation of the pulses applied to the reversible counter 40. When the potential on the lead 17 goes low, the transistor 20 is rendered nonconductive; thereby reconnecting the high value resistor 26 in the oscillator loop circuit and preventing further operation of the oscillator so long as the switches 22 and 23 also remain open.

If the switch 22 or 23, which was closed to initiate operation, is held closed while the system is cycling through the channel selection, the oscillator 27 will switch from its high frequency rate of operation, just described, for unselected or non-preferred channels, to its low frequency rate of operation whenever selected channels causing a low potential to appear on the lead 17 are detected. This permits the operator to release the switch 22 or 23 if he wants to stop on such a "preferred" channel.

The change from a high frequency of operation to a low frequency of operation occurs as a result of changes in the potential on the line 27 applied through the isolating diode 43. When the potential on the line 17 goes low, the diode 43 is back-biased and removed from the circuit. This causes the charging of the timing capacitor 24 for the oscillator to be at its low frequency rate through the resistor 30 for each time a valid or preferred channel is detected even though the switch 22 or 23 remains closed. If the switch 22 or 23 then is released while a valid channel is still detected or selected with a low potential on lead 17, the operation of the oscillator stops as desribed previously, and the selected channel remains.

The counter section of the system includes the "units" reversible counter 40 described previously and a "tens" reversible counter 45, which is supplied with input pulses from an output of the units counter 40 whenever the counter 40 reaches a count corresponding to the number 10 in its cycle of operation. The direction of operation of the counters 40 and 45 is effected by the switch contact 23b on the "tune down" switch 23. If the switch 23b is open at the time pulses are applied to the input of the counter 40 from the transistor 36, this condition is indicative of an up count; and a positive voltage from a B+ supply (not shown) is applied to the direction control inputs 46 and 47 of the counters 40 and 45, respectively. If the oscillator is being operated under control of closure of the "tune down" switch 23, ground potential is applied to the direction control inputs 46 and 47, causing the counters 40 and 45 to operate in the reverse direction.

The counters 40 and 45 can be any suitable reversible counter, and for purposes of illustration are shown as producing output signals in the form of binary coded decimal (BCD) signals on four output leads from each counter. The use of BCD counters fro the counters 40 and 45 is not to be considered restrictive; but counters on this type produce output signals in a convenient form for utilization by units and tens decoder and display driver circuits 48 and 49, which convert the bianry coded decimal input signals applied to their inputs to corresponding decoded outputs on seven output leads for driving the units and tens segments of seven segment digital displays 51 and 52, respectively. These displays are commonly employed for displaying digital information and are ideal for displaying television channel numbers. Displays 51 and 52 can take any suitable form, such as incandescent or LED read-out segments. The decoding of the BCD input signals to the corresponding seven segment output by the decoder units 48 and 49 may be effected in any suitable manner. Again it should be noted that the seven segment displays 51 and 52 are merely illustrative, and other types of displays can be used if desired.

To prevent annoying flicker of the indicia produced by the display units 51 and 52 during the high frequency operation of the oscillator 27, the transistor 19 is employed. As stated previously, the transistor 19 is rendered conductive when the potential on the lead 17 goes high to initiate the high speed operation of the oscillator 27. Conduction of the transistor 19 applies a near ground potential to blanking inputs 54 and 55 on each of the decoder driver circuits 48 and 49. This causes the outputs supplied by these circuits to be such that no numbers are displayed on the display units 51 and 52 during the high speed operation of the oscillator 27. When a preferred or valid channel is selected by the system, the potential on the lead 17 goes low, as described previously, and the transistor 19 becomes nonconductive. This removes the ground potential from the blanking inputs 54 and 55 and permits the decoder driver units 48 and 49 to supply the appropriate outputs to drive the display units 51 and 52 to indicate the number of the selected channel.

The tuning voltage applied to the tuner circuit 11 of the television receiver is selected to correspond with the numbers displayed on the display units 51 and 52. To accomplish this, the binary coded decimal outputs of the units counter 40 and the tens counter 45 are applied to corresponding inputs of a units BCD-to-decimal decoder circuit 54 and a tens BCD-to-decimal decoder circuit 55. These circuits each have ten output leads, each corresonding to the decoded decimal number for a different BCD encoded input applied to the decoder unit. All ten outputs of the units decoder 54 are used, but only the zero through eight outputs of the tens decoder 55 are used since there are no UHF channels having numbers in the 90s.

Each of the outputs from the decoders 54 and 55 are connected through an appropriate load resistor 57 to a source of positive potential (illustrated as being +30 volts). Selection of a decimal output from the decoders 54 and 55 operates to apply ground potential to the output lead corresponding to the decoded number.

Only one output from each decoder has ground potential applied to it at any given time, and all of the other outputs effectively are at an open circuit condition. This can be accomplished by the decoders 54 and 55 in any convenient conventional manner.

A determination of the selection of any given channel then is made by sensing the outputs of the tens and units decoders 55 and 54. For the selected channel, both of the outputs are low or near ground potential. This occurs only for the one channel represented by the combination of the two outputs from the decoders 54 and 55. The connections for all of the other channels have at least one decoder output which is high.

For each channel, the appropriate decoder outputs are connected through a resistor 60 to the lead corresponding to the tens digit for that channel and through a lead 61 to the output of the decoder 54 corresponding to the units digit for that channel number. The resistors 60 and 61 then are coupled in common to the lower end of a potentiometer circuit, which for channel 2 is identified as potentiometer circuit 62 in FIG. 1b. For the potentiometer 62, the resistor 60 is connected to the zero output of the tens decoder 55 and the resistor 61 is connected to the 2 output of the units decoder 54. These are connections necessary to decode an output corresonding to channel 2.

Decoder outputs for channels 6, 7, 12, 44 and 60 also are shown connected to corresponding other combinations of outputs of the units and tens decoders 54 and 55. Only these six channels are shown for purposes of illustration, but it is to be understood that all of the VHF channels and any desired number of the UHF channels are similarly connected to the appropriate decoder outputs. To show the additional connections for all of the channels would merely unnecessarily clutter the drawing.

For the VHF channels, all of the connections through the resistors 60 and 61 can be hard-wired to the outputs of the decoders 54 and 55. If not all of the large number of UHF channels are desired to be permanently wired into the receiver, a selected number, typically 6, UHF channel positions are provided to be programmably wired or connected to the outputs of the decoders 54 and 55. These then are connected to select those UHF stations in the given locality where the receiver is to be operated. This programmable connection is illustrated in FIG. 1a by the arrowhead connections of the resistors 60 and 61 to the appropriate output leads from the decoders 54 and 55. In all other respects, selection of the VHF and UHF channels is exactly the same.

A regulated direct current voltage is applied over a lead 59 and through corresponding resistors 68, 69 and 70 to the upper ends of the tuning voltage selection potentiometers 62 to 67, shown in FIG. 1b. The taps of all of the potentiometers 62 to 67 are coupled through isolating diodes which comprise an analog steering circuit to a common tuning voltage output lead 71 on which the tuning voltage for the selected potentiometer appears.

The voltage on the terminal 59 is a regulated voltage obtained from a positive potential source applied to a terminal 72 through a voltage divider comprising a resistor 74 and a Zener diode 76. The junction of the resistor 74 and the diode 76 is coupled through a coupling resistor 77 to one input of an operational amplifier 80 and the output of the amplifier 80 comprises the regulated direct current voltage on the lead 59. This voltage typically has a value of approximately 12 volts.

To achieve the AFT regulation in response to the discriminator in the receiver stages 13 of the television receiver, the AFT voltage on the lead 16 is applied to the other input of the operational amplifier 80. The AFT voltage either adds to or subtracts from the regulated voltage applied to the amplifier 80 through the resistor 77 to achieve the AFT regulation by varying the voltage on the lead 59 in accordance with the AFT voltage. Thus, the composite voltage applied over the lead 59 from the output of the operational amplifier 80 includes the AFT corrections. These, of course, are reflected in the tuning voltages on the taps of the tuning potentiometers which generate the tuning voltages.

Figure 3:
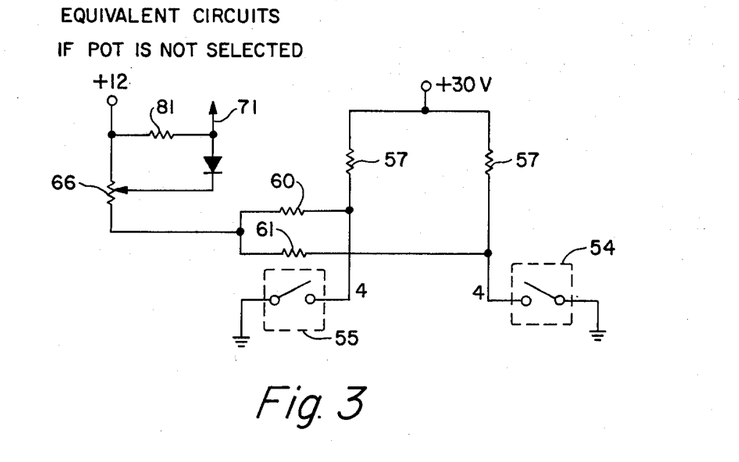
FIGS. 3 to 5 illustrate the operation of a portion of the circuit shown in FIGS. 1a and 1b.
Figure 4:
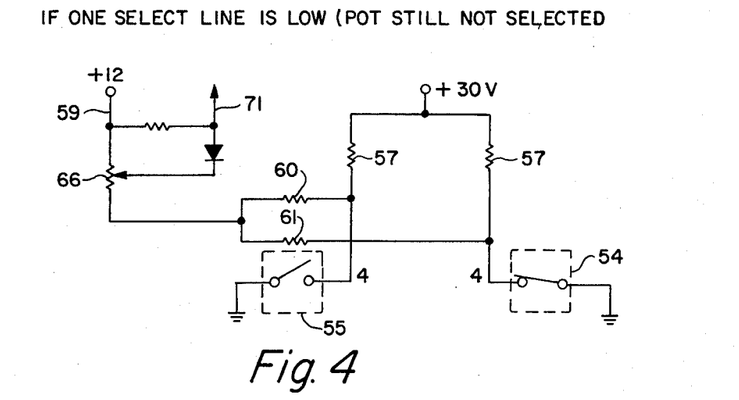
Figure 5:
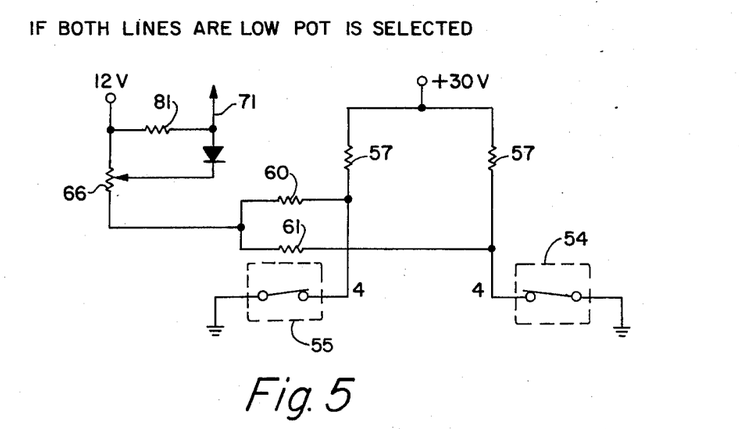

Reference now should be made to FIGS. 3, 4 and 5 which illustrate the maner in which a potentiometer is selected in accordance with the output voltages appearing on the output lines from the BCD-to-decimal decoders 54 and 55. For purposes of illustration, the potentiometer 66 is shown; but the description is not limited to that particular potentiometer since its applies equally to the selection of any one of the other potentiometers in the system. The same reference numbers are used in FIGS. 3, 4 and 5 to designate the same or similar components as appear in FIGS. 1a and 1b.

The functional operation of the decoders 54 and 55 for any given output lead is to connect the lead to ground by closure of a switch within the decoders for the single decoded output and to open the switches within the decoders for the other non-selected output leads. This is illustrated in FIGS. 3, 4 and 5 by the dotted line boxes 54 and 55 drawn around a single-pole single-throw switch, illustrated as connected to the output representative of the decimal number 4 for each of the two decoders. As described previously in conjunction with FIGS. 1a and 1b, the potentiometers 66 is associated with UHF channel 44. Referring now to FIGS. 3, 4 and 5, if both of the decoders 54 and 55 have selected some number other than 4, the decimal number 4 outputs of both decoders are coupled to open circuits, as illustrated in FIG. 3. This causes the potential applied to the lower end of the potentiometer 66 through the resistors 60 and 61 to be higher than the +12 volts supplied on the lead 59, back-biasing the isolating diode coupled to the tap for the potentiometer 66.

If one of the decoders 54 or 55 closes its 4 output to ground, as illustrated in FIG. 4 for the decoder 54, a path is completed from the +30 volt supply through one of the resistors 57 and the resistors 60 and 61 to ground through the closed switch. If the other of the decoders, for example decoder 55 in FIG. 4, continues to have its 4 output open, however, the potential at the junction of the resistors 60 and 61 is still greater than the regulated +12 volt potential on the lead 59 due to the selection of the relative values of the resistors 57, 60 and 61. As a consequence, the isolating diode remains back-biased and no output is obtained from the potentiometer 66.

When the tuning potentiometers for channel 44 is selected, however, the switches for the 4 outputs in both of the decoders 54 and 55 are closed, as illustrated in FIG. 5. This condition places ground potential on the righthand ends of both of the resistors 60 and 61, resulting in a voltage divider from the regulated 12 volt supply voltage on lead 59 through the potentiometer 66 and the resistors 60 and 61 to ground. The potential on the cathode of the isolating diode for the potentiometer 66 then drops to forward-bias the diode causing a corresponding potential to appear on its anode. This clamps the righthand end of an isolating resistor 81 to a potential which is one diode drop higher than the potential on the tap of the potentiometer 66. This potential, for a preferred or valid channel, establishes a low tuning voltage (approximately 2 to 4 volts) on the lead 71 for the selected channel. Of course, the actual voltage appearing on the lead 71 is determined by the setting of the tap on the potentiometer.

Referring again to FIG. 1b, it is to be noted that the potentiometers 62 and 67 are grouped into three groups, corresponding to the low VHF, high VHF, and UHF channels, respectively. As is well known, it is necessary to determine the particular group in which the channel to which the receiver is being tuned belongs, to enable for operation the proper sections of the VHF and UHF tuners in the receiver. Thus, all of the low band VHF channels (channels 2 to 6) have the upper ends of their potentiometers coupled in common to the lower end of the resistor 68 and to the emitter of an NPN switching transistor 84, the base of which is connected to the upper end of the resistors. Comparable connections are made for the high band VHF channels (channel numbers 7 to 13) for controlling the operation of an NPN switching transistor 85, and for the UHF channels to control the operation of an NPN switching transistor 86.

The transistors 84, 85 and 86 are nonconductive so long as none of the potentiometers connected to them are selected by the decoders 54 and 55 in response to operation of the reversible counters 40 and 45. Whenever any one potentiometer associated with any of these switching transistors 84, 85 or 86, however, is selected, current flows through the corresponding resistor 68, 69 or 70 from the regulated supply potential on the lead 58 through the selected potentiometer to ground, as described previously in conjunction with the circuits shown in FIGS. 3, 4 and 5. Current flow through any of the resistors 68, 69 or 70 causes the corresponding NPN transistor to be forward-biased into saturation. This causes the potential on the collector of such a conducting switching transistor to drop to a lower potential.

If a UHF channel is selected, the lower negative-going potential appears on the collector of the transistor 86 and drives a corresponding PNP transistor 90 into conduction to apply a positive potential from its collector to the VHF and UHF tuner section 11. This operates to energize the UHF oscillator of the tuner. At the same time, a pair of PNP transistors 91 and 92 for controlling the VHF sections of the tuners both are nonconductive.

If either a low-band or a high-band VHF tuner is selected, the transistor 92 is rendered conductive, and the transistor 90 is nonconductive; so that the VHF oscillator is enabled for operation and the UHF oscillator is disabled. If the selection of a potentiometer is in the low-band VHF section, only the transistor 92 is conductive. If the selected potentiometer is a high-band VHF potentiometer, both the transistors 91 and 92 are rendered conductive. The output of the transistor 91 is indicative of a high-band selection and effects the proper control of elements in the tuner section in a conventional manner.

The tuning voltage appearing on the lead 71 is applied to the input of an operational amplifier 94, the output of which is desired tuning voltage on the lead 15 for establishing the tuning of the selected VHF or UHF sections of the tuner in the tuner section 11. For a valid channel, this tuning voltage is a relatively low voltage, as described previously in conjunction with FIG. 5. This causes a PNP override control transistor 96 to be rendered conductive, applying a position potential on the base of an NPN override output transistor 98 to render that transistor conductive. Conduction of the transistor 98 places a near ground or low potential on the lead 17 to cause the transistors 19 and 20 to be biased off, as described previously in conjunction with the description of operation of the clock pulse oscillator circuit 27. This causes the oscillator to operate at its low frequency rate.

If a potentiometer 62 to 67 is associated with a channel which is non-preferred or not valid for the locality in which the receiver is being used, the tap on the potentiometer is set to its highest output voltage or maximum value. This is a setting at the upper ends of the potentiometers. If the potentiometers have an open or nonconductive portion, as some potentiometers commonly employed in television receivers have, then the tap should be set to such an open circuit position for a non-preferred channel.

When the reversible counters 40 and 45 then cause the decoders 54 and 55 to select such a non-preferred potentiometer, a relatively high positive potential is applied to the input of the operational amplifier 94, either from the tap of the selected potentiometers set to its maximum voltage setting, or if a potentiometer having an open section is used, the high potential is applied directly through the resistor 81 from the operational amplifier 80. In any event, the voltage for such a non-preferred channel is a high voltage, greater than that commonly employed to tune the receiver to a valid channel. This high voltage is sufficient to reverse-bias the override control transistor 96, which in turn causes the transistor 98 to be nonconductive. As a result, the relatively high positive potential on a voltage input terminal 100 is applied through a coupling resistor 101 to the lead 17 to operate as the voltage supply for the fast charging circuit of the timing capacitor 24, since this potential is sufficient to forward-bias the isolating diode 43.

At the same time, the transistors 19 and 20 are rendered conductive to effect the operation described previously for those transistors. In this manner, the settings of the tuning voltage selection potentiometers for the different channels effect the override control of the operation of the gated clock pulse oscillator 27 automatically to place the oscillator 27 in its high frequency mode of operation for non-preferred or invalid channels which are to be skipped in the operation of the system.

The output appearing on the collector of the transistor 98 also can be applied to the receiver stages 13 to blank the picture and provide audio muting whenever a high potential appears on the lead 17 for the skip mode or high-frequency mode of operation of the system to prevent annoying static or noise in the audio output of the receiver and to prevent similarly annoying flicker of the picture on the picture tube 14.

We claim:

1. An electronic tuner control system including in combination:
    a gated clock pulse generator for producing clock pulses at least one frequency on an output thereof;

control means energizable for initiating and maintaining operation of said gated clock pulse generator to cause said clock pulse generator to produce said clock pulses in response thereto and to terminate production of said clock pulses upon de-energization of said control means;

a plurality of tuning signal selecting means, at least some of which are settable for producing first tuning signals in a first predetermined range indicative of a preferred setting of tuning signals, and capable of producing second signals in a second predetermined range indicative ov non-preferred tuning signals;

an analog tuning output terminal;

means coupled with the output of said gated clock pulse generator and response to said clock pulses for sequentially causing different ones of said plurality of tuning signal selecting means to be coupled with said analog tuning output terminal to control the tuning signal in said first and second predetermined ranges produced on said output terminal;

overriding means having an input coupled with said analog tuning output terminal and responsive to signals appearing on said output terminal, and further coupled with said gated clock pulse generator for overriding said control means and maintaining operation of said gated clock pulse generator for so long as an input signal to said overriding means is within said second predetermined range of signals and for terminating operation of said gated clock pulse generator following de-energization of said control means when the input signal to said overriding means is in said first predetermined range of signals.

2. The combination according to claim 1 wherein said plurality of tuning signal selecting means comprises a plurality of potentiometers, and said means for sequentially causing different ones of said plurality of tuning signal selecting means to be coupled with said analog tuning output terminal causes said potentiometers to be sequentially connected across a source of direct current potential, each of said potentiometers having an adjustable tap, and further including means for coupling the adjustable taps of said potentiometers with said analog tuning output terminal.

3. The combination according to claim 1 wherein said means for sequentially causing different ones of said plurality of tuning signal selecting means to be coupled with said analog tuning output terminal includes a reversible counter, and further including means coupled with said control means for establishing the direction of counting of said reversible counter.

4. The combination according to claim 1 wherein said gated clock pulse generator is capable of producing pulses on said output terminal thereof at first and second frequencies, said second frequency being higher than said first frequency, said control means causing said clock pulse generator to produce pulses at one of said frequencies and said overriding means causing said clock pulse generator to produce pulses at at least the other of said first and second frequencies in response to signals on said analog tuning output terminal.

5. The combination according to claim 4 wherein said overriding means causes said clock pulse generator to produce pulses at said first and second frequencies in response to signals on said analog tuning output terminal in said first and second predetermined ranges of signals, respectively, so long as said control means is energized.

6. An electronic tuner control system including in combination:

a gated clock pulse generator for producing clock pulses at at least one frequency on an output thereof;

a plurality of tuning voltage selection circuit means, each settable to provide tuning voltages in either a first predetermined range or a second predetermined range;

analog steering circuit means having a plurality of imputs each coupled with a different one of said plurality of tuning voltage selection circuit means for producing on an analog output terminal an analog tuner control voltage corresponding to the setting of a selected tuning voltage selection circuit means;

means coupled with the output of said gated clock pulse generator and coupled with said tuning voltage selection circuit means for sequentially energizing said tuning voltage selection circuit means one at a time under control of said clock pulses;

control means for initiating and maintaining said gated clock pulse generator into operation in response to a predetermined input condition and for terminating operation of said gated clock pulse generator upon cessation of said predetermined input condition; and override means coupled with said analog steering circuit and responsive to said analog tuner control voltage and further coupled with said gated clock pulse generator for maintaining operation thereof after cessation of said predetermined input condition in response to analog tuner control voltages in said second predetermined range of voltages and for terminating operation of said gated clock pulse generator circuit in response to analog tuner control voltages in said first predetermined range of voltages.

7. The combination according to claim 6 wherein said means for sequentially energizing said tuning voltage selection circuit means includes reversible counting means, and said control means comprises at least first and second control means coupled with said reversible counting means, said first control means operating to cause said reversible counting means to sequentially energize said tuning voltage selection circuit means in one direction and said second control means operating to cause said reversible counting means to sequentially energize said tuning voltage selection circuit means in the opposite direction.

8. The combination according to claim 6 wherein said plurality of tuning voltage selection circuit means comprises a plurality of potentiometers each having an adjustable tap coupled with a different one of the plurality of inputs of said analog steering circuit means, and said means for sequentially energizing said tuning voltage selection circuit means comprises means for connecting said potentiometers across a source of direct current potential one at a time under control of said clock pulses.

9. The combination according to claim 6 wherein said gated clock pulse generator is capable of producing pulses on said output terminal thereof at first and second frequencies, said second frequency being higher than said first frequency, said control means causing said clock pulse generator to produce pulses at one of said first and second frequencies and said override means causing said clock pulse generator to produce pulses at at least the other of said first and second frequencies in response to analog tuner control voltages in one of said first and second predetermined ranges irrespective of the input condition of said control means.

10. The combination according to claim 9 wherein said override means causes said gated clock pulse generator to produce pulses at said first and second frequencies, respectively, in response to tuner control voltages on said analog output terminal in said first and second predetermined ranges, so long as said control means maintains said predetermined input conditions.

11. An electronic tuning control system including in combination:
- a gated clock pulse generator capable of producing output pulses on an output terminal thereof at first and second frequencies, said second frequency being higher than said first frequency;
- control circuit means for initiating and maintaining operation of said gated clock pulse generator at one of said first and second frequencies of operation in response to a control signal input, operation of said oscillator under control of said control means terminating upon removal of said control signal input;
- means for applying a control signal input to said control circuit means;
- a plurality of tuning voltage generating means, each settable to provide tuning voltages in first and second predetermined ranges of voltages;
- analog steering circuit means coupled with each of said tuning voltage generating means to provide an analog tuning voltage on its output having a predetermined relationship to the tuning voltage applied thereto from said tuning voltage generating means;
- means coupled with the output of said gated clock pulse generator and further coupled with said tuning voltage generating means for sequentially enabling said tuning voltage generating means to supply tuning voltages to said analog steering circuit means in response to clock pulses from the output of said gated clock pulse generator;
- override means coupled with said analog steering circuit means for providing a first output signal on an output thereof in response to tuning voltages supplied to said analog steering circuit means in said first predetermined range and for providing a second output signal on the output thereof in response to tuning voltages supplied to said analog steering circuit means in said second predetermined range; and
- means coupling the output of said override means with said gated clock pulse generator for causing said gated clock pulse generator to produce clock pulses at the other of said first and second frequencies of operation in response to said second output voltage from said control circuit means.

12. The combination according to claim 11 wherein said plurality of tuning voltage generating means comprises a plurality of potentiometers each having an adjustable tap coupled with said analog steering circuit means, and said means for sequentially enabling said tuning voltage generating means comprises means for connecting said potentiometers sequentially across a direct current supply voltage.

13. The combination according to claim 12 wherein said override means causes said gated clock pulse generator to produce clock pulses at said first and second frequencies, respectively, in response to tuning voltages in said first and second predetermined ranges of voltages, for the duration of said control signal input.

* * * * *